(12) United States Patent
Mittelholzer

(10) Patent No.: US 7,616,134 B1
(45) Date of Patent: Nov. 10, 2009

(54) SYSTEMS AND METHODS FOR ENUMERATIVE ENCODING AND DECODING OF MAXIMUM-TRANSITION-RUN CODES AND PRML (G,I,M) CODES

(75) Inventor: Thomas Mittelholzer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/142,325

(22) Filed: Jun. 19, 2008

(51) Int. Cl.
*H03M 5/00* (2006.01)

(52) U.S. Cl. .............................. 341/58; 360/40; 360/48; 369/59.23; 714/701

(58) Field of Classification Search ............. 341/58–80; 360/40–48; 369/59.23, 59.24; 714/701, 714/769–771, 791–796
See application file for complete search history.

(56) References Cited

U.S. PATENT DOCUMENTS

| | | | |
|---|---|---|---|
| 5,760,718 A | | 6/1998 | Schouhamer Immink |
| 6,081,210 A | * | 6/2000 | Nikolic et al. .................. 341/59 |
| 6,388,587 B1 | * | 5/2002 | Brickner et al. ............... 341/59 |
| 7,064,687 B1 | | 6/2006 | Blaum et al. |
| 7,071,851 B1 | | 7/2006 | Blaum et al. |
| 7,126,502 B2 | | 10/2006 | Blaum et al. |
| 7,164,371 B2 | * | 1/2007 | Lee et al. ....................... 341/58 |
| 7,530,003 B2 | * | 5/2009 | Lee et al. ....................... 714/759 |

OTHER PUBLICATIONS

Blaum et al., Enumerative Encoding with Non-Uniform Modulation Constraints; ISIT2007, Nice, France; 2007; pp. 1831-1835.
Blaum et al., High-Rate Modulation Codes for Reverse Concatenation; IEEE Trans on Magnetics, vol. 43, No. 2; Feb. 2007; pp. 740-743.
Cideciyan et al., A PRML System for Digital Magnetic Recording; IEEE Journal on Selected Areas in Communication; vol. 10, No. 1; Jan. 1992; pp. 38-56.
Cideciyan et al., Maximum Transition Run Codes for Generalized Partial Response Channels; IEEE Journal on Selected Areas in Communication; vol. 19, No. 4, Apr. 2001; pp. 619-634.
Cover et al., Enumerative Source Encoding; IEEE Trans on Information Theory; vol. IT-19, No. 1; Jan. 1973; pp. 73-77.

(Continued)

*Primary Examiner*—Lam T Mai
(74) *Attorney, Agent, or Firm*—Keusey, Tutunjian & Bitetto, P.C.; James J. Bitetto, Esq.

(57) ABSTRACT

Systems and methods for encoding/decoding are provided. The systems and methods include encoding a stream of K-bit input sequences into a stream of (G, I, M)-constrained 2N-bit output sequences by transforming each K-bit input bit sequence into two separate data paths including even and odd bits. Enumerative maximum-transition-run (eMTR) encoding of the even bits generates constrained even bits, and enumerative maximum-transition-run (MTR) encoding of the odd bits generates constrained odd bits. The constrained even and constrained odd bits are interleaved to form a stream of (G, I, M)-constrained 2N-bit output sequences where G is a global constraint, I is an interleave constraint, and M is a variable frequency oscillator constraint of a partial-response maximum-likelihood (PRML) codeword. Decoding systems and methods are also provided.

23 Claims, 5 Drawing Sheets

OTHER PUBLICATIONS

Immink; A Practical Method for Approaching the Channel Capacity of Constrained Channels; IEEE Trans on Information Theory; vol. 43, No. 5; Sep. 1997; pp. 1389-1399.

Kautz; Fibonacci Codes for Synchronization Control; IEEE Trans on Information Theory; vol. 11; Apr. 1965; pp. 284-292.

Mittelholzer et al., Reverse Concatenation of Product and Modulation Codes; IEEE International Conf on Communication; 2008; ICC '08; May 2008; pp. 1991-1995.

Moon et al., Maximum Transition Run Codes for Data Storage Systems; IEEE Trans on Magnetics, vol. 32, No. 5,: Sep. 1996; pp. 3992 - 3994.

* cited by examiner

SYSTEMS AND METHODS FOR ENUMERATIVE ENCODING AND DECODING OF MAXIMUM-TRANSITION-RUN CODES AND PRML (G,I,M) CODES

RELATED APPLICATION INFORMATION

This application is related to U.S. patent application Ser. No. 12/142,305, filed currently herewith and incorporated herein by reference in its entirety.

BACKGROUND

1. Technical Field

The present invention relates to maximum-transition-run (MTR) block codes for use in partial response maximum likelihood (PRML) based recording systems and particularly to a new class of PRML(G, I, M) codes which in addition to the global G-constraint and the interleaved I-constraint enforce a variable frequency oscillator (VFO) constraint also known as an M-constraint.

2. Description of the Related Art

In magnetic recording and optical storage, modulation constraints are employed on recorded binary sequences to facilitate timing recovery and ensure efficient operation of a detector. The large class of PRML(G, I) codes, which are based on even/odd interleaved generalized Fibonacci codes, satisfy G and I constraints but do not achieve the desired VFO constraint.

SUMMARY

A frequently used modulation constraint is the k constraint, which limits the maximum number of consecutive zeros in a binary sequence to k. The j constraint is dual to the k constraint, i.e., it limits the maximum number of consecutive ones in a binary sequence to j. The class of (generalized) Fibonacci codes is an example of efficiently encodable block codes, which enforce a predetermined j constraint. By applying bit inversion to all codewords in a Fibonacci code, the j constraint is transformed into a k constraint. Thus, for a pure j constraint or a pure k constraint the Fibonacci codes and the bit-flipped Fibonacci codes form a class of highly efficient enumerative modulation codes. However, in the case of mixed maximum transition run (MTR)-constraints, i.e., with finite values of j and k, the class of Fibonacci codes does not achieve the desired constraints.

For mixed MTR-constraints, a novel enumerative encoding/decoding scheme is presented, which is a generalization of the Fibonacci codes and generates MTR modulation codes with predetermined j and k constraints.

In storage systems, user data is usually first encoded by an error-correcting code (ECC) before it is passed through a modulation encoder and, therefore, error propagation at the modulation decoder is an important practical issue. For this reason, most practical modulation block codes are relatively short. Some of the presented MTR codes are specially designed to have reduced error propagation. In fact, the maximum error propagation length (in bits) is a design parameter, which can be suitably selected in the construction of present enumerative MTR (EMTR) codes in accordance with the present principles.

In a reverse concatenation (RC) scheme, the order of the ECC encoder and the modulation encoder is reversed, i.e., the user data is first modulation encoded before it is passed through the ECC encoder. Hence, during read back, the ECC decoder operates before the modulation decoder and, thus, there is no error propagation except for the extremely rare event that the ECC decoder makes an error. For this reason, one can choose to use long modulation codes in an RC scheme, which operate close to the capacity of the selected constraint. Reverse concatenation architectures have been considered in the prior art, and recently, they have been implemented in hard disk drive products. For the RC framework, a design method for long, high-rate MTR(j, k) and PRML(G, I, M) codes is presented and illustrated by numerous examples of capacity efficient codes.

Systems and methods for encoding/decoding PRML(G, I, M) codes are provided. The systems and methods include encoding a stream of K-bit input sequences into a stream of (G, I, M)-constrained 2N-bit output sequences by transforming each K-bit input bit sequence into two separate data paths including even and odd bits. Enumerative maximum-transition-run (eMTR) encoding of the even bits generates constrained even bits, and enumerative maximum-transition-run (MTR) encoding of the odd bits generates constrained odd bits. The constrained even and constrained odd bits are interleaved to form a stream of (G, I, M)-constrained 2N-bit output sequences where G is a global constraint, I is an interleave constraint, and M is a variable frequency oscillator constraint of a partial-response maximum-likelihood (PRML) codeword. Decoding systems and methods are also provided.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
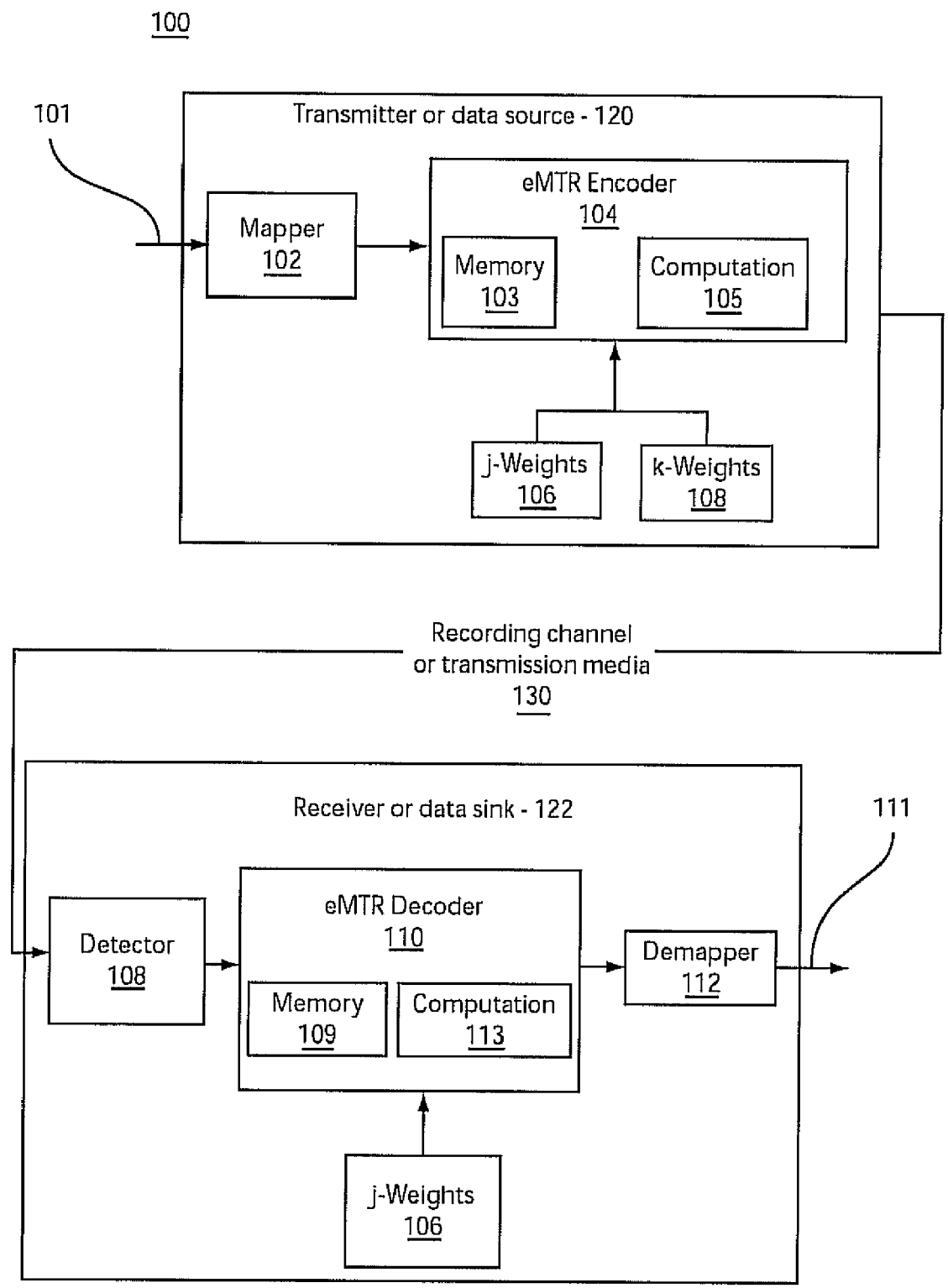
FIG. 1 is a block/flow diagram showing an encoder system and a decoder system in accordance with one illustrative embodiment.

A large class of maximum-transition-run (MTR) block codes is presented, which is based on a novel low-complexity enumerative encoding/decoding scheme. This new class of MTR codes is obtained by a general design method to construct capacity-efficient MTR codes with predetermined j and k constraints and limited error propagation at the decoder.

Two-way interleaving of these codes yields long high-rate PRML(G, I, M) modulation codes satisfying tight global G=2k and interleaved I=k constraints. Moreover, these (G, I)-constrained codes satisfy the M=2j constraint, i.e., they have limited runs of alternating 2T magnets at the channel input.

Embodiments of the present invention can take the form of an entirely hardware embodiment, an entirely software embodiment or an embodiment including both hardware and software elements. In a preferred embodiment, the present invention is implemented in hardware, but may include software elements. The software may include but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The system described herein may be part of the design for an integrated circuit chip or system of chips. The chip design is preferably created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A new maximum-transition-run (MTR) system/method is illustratively shown with its enumerative encoder and decoder. Enumerative encoding of MTR codes may include the following. Suppose that finite j and k constraints are specified, where without loss of essential generality, one can assume $j \leq k$ (otherwise one applies bit inversion to all codewords, which interchanges the j and the k constraints). For each N, a MTR block code of length N will be defined based on a set of weights $\{(v_n, w_n)\}$, n=1, 2, ..., N, which will be called mtr-weights. The sequences $\{v_n\}$ and $\{w_n\}$ will be called the k-weights and the j-weights, respectively. The weights are determined by initial conditions and linear recursions, which reflect the k and the j constraints. The initial mtr-weights are defined by:

$$v_n = 0 \text{ for } n=1, 2, \ldots, k+1 \qquad (1)$$

$$w_n = 2^{n-1} \text{ for } n=1, 2, \ldots, j+1 \qquad (2).$$

The two interlinked recursions are given by:

$$v_{n+1} = v_{n-k} + w_{n-k} \text{ for } n \geq k+1 \qquad (3)$$

$$w_{n+1} = w_n + w_{n-1} + \ldots + w_{n-j} - v_{n+1} + v_{n-j} \text{ for } n \geq j+1. \qquad (4)$$

Note that the j-weights form a monotonically increasing sequence and the k-weights are monotonically non-decreasing.

We start with the description of an encoder of a code of length N. First, we define the input space U, which includes all integers u in the half-open interval $[L_N; U_N)$ with lower and upper boundaries $L_N$ and $U_N$, which are given by:

$$L_N = v_{N-k} + w_{N-k} \qquad (5)$$

$$U_N = w_N + w_{N-1} + \ldots + w_{N-j} + v_{N-j}. \qquad (6)$$

Thus, $U = \{u: L_N \leq u < U_N\}$. A way to map binary inputs $u_1, u_2, \ldots, u_N$ into integers u in the input space U, may include adding the offset $L_N$ to the sum $$\sum_{i=1}^{N} u_i 2^{N-1},$$

i.e., by the assignment $$u = \sum_{i=1}^{N} u_i 2^{N-1} + L_N.$$

Moreover, one needs to ensure that u does not exceed the upper bound $U_N$ by suitably restricting the binary inputs. We are not here concerned with this mapping and will assume that the input is an integer u belonging to the input space U.

Given an input u∈U, the encoder computes the binary output sequence $x_1, x_2, \ldots, x_N$ based on the following method.

For l=1 to N do:

if $u \geq v_{N-l+1} + w_{N-l+1}$ $x_l=1$, $u=u-w_{N-l+1}$ else $x_l=0$. (7)

The encoding method leads to a representation of the input as a weighted sum with binary coefficients $$u = \sum_{l=1}^{N} x_l w_{N-l+1}. \quad (8)$$

The decoder is based on this weighted-sum representation. Given a codeword $x_1, x_2, \ldots, x_N$, the decoder first initializes the output to u=0 and then performs the following N steps.

For n=1 to N do: if $x_{N-n+1}=1$ then $u=u+w_n$. (9)

The code of length N, which includes all output sequences $x_1, \ldots, x_N$ generated by inputs u∈U, will be called a pure enumerative maximum transition run code with parameters j and k. The encoding and decoding methods (7) and (9) will be referred to as eMTR-encoder and eMTR-decoder.

The binary-input/output decoder includes a generic decoder followed by the inverse offset mapping, which maps an integer u into $u-L_N$. The output bits $u_i$ of the decoder are read-off from the binary representation of $u-L_N$.

Binary-Input/Output Decoder:

Input: binary vector $[x_1, x_2, \ldots, x_N]$

Output: binary vector $[u_1, u_2, \ldots, u_K]$

Generic decoder: For n=1 to N do
{if $x_{N-n+1}=1$ then $u=u+w_n$}

Inverse offset mapping: $\Sigma_{i=1 \ldots K} u_i 2^{K-i} = u - L_N$,
where K=floor($\log_2(U_N - L_N)$)

While maintaining the same encoding and decoding methods (7) and (9), one can weaken the defining equations (1)-(6) for the mtr-weights and obtain a larger class of codes. Specifically, one makes the j-weights to be positive integers, while generalizing the initial conditions and the two recursions for the mtr-weights to:

$v_n \geq 0$ $n=1, 2, \ldots, k+1$ (10)

$w_n \leq 2^{n-1}$ $n=1, 2, \ldots, j+1$ (11)

$v_{n+1} \geq v_{n-k} + w_{n-k}$ $n=k+1, \ldots, N-1$ (12)

$w_{n+1} \leq w_n + w_{n-1} + \ldots + w_{n-j} - v_{n+1} + v_{n-j}$ $n=j+1, \ldots, N-1$. (13)

Moreover, the lower and upper bounds of the input space can be chosen as:

$L_N \geq v_{N-k} + w_{N-k}$ (14)

$U_N \leq w_N + w_{N-1} + \ldots + w_{N-j} + v_{N-j}$ (15)

The resulting codes will be called enumerative maximum transition run (eMTR) codes and a code with parameters (N, j, k) will be called an eMTR(j, k) code of length N or EMTR (N, j, k). Note that for a given set of parameters (N, j, k), there is exactly one pure eMTR(j, k) code of length N but there are many possible eMTR(j, k) codes of length N codes. The more general recursions and lower and upper bounds (10)-(15) allow one to construct practical codes with tighter constraints at the codeword boundaries and to design complexity-efficient encoders/decoders. This comes at the price of a slight reduction in the number of codewords compared to the pure eMTR codes, which have the largest number of codewords for a given set of parameters (N, j, k).

We will now derive the basic properties of eMTR codes. In particular, the codes satisfy the predetermined j and k constraints and that the encoding is indeed based on codeword enumeration. It can be proven that eMTR(j, k) code of length N satisfy both the j and k constraints. Hence, the j constraint and the k constraint cannot be violated.

The eMTR-encoder/decoder can be described in terms of enumerative encoding techniques. However, in contrast to other enumerative encoding techniques, the enumeration of codewords in accordance with the present principles does not start at 0 but at the offset $L_N$. Enumerative encoding is a technique for the construction of an encoder/decoder for some block code. To this end, one introduces the lexicographical order on the set of all eMTR(j, k) length-N codewords, which are a subset of all binary length-N sequences. The ordering is chosen such that the left most bit $x_1$ in a sequence $x_1, x_2, \ldots, x_N$ is the most significant bit.

Enumerative encoding: The eMTR-encoder specifies an order preserving one-to-one map from the input space U onto the eMTR(j, k) code of length N. The eMTR(j, k) code of length N with lower and upper bounds $L_N$ and UN given by (14) and (15) includes $U_N - L_N$ codewords.

Practical EMTR codes: Practical codes should maintain tight constraints across codeword boundaries and have simple encoder/decoder implementations. For this reason, practical eMTR codes are based on the generalized recursions (10)-(15). The parameter j=j(n) in (13), which determines the j constraint, can be chosen to be dependent on the location n. For example, if j(n)=4, then the encoder (7) generates a codeword, which satisfies $x_l x_{l+1} x_{l+2} x_{l+3} x_{l+4} = 0$, where l=N-n+1. Thus, an eMTR code has a j-profile that may depend on the location n within a constrained codeword and, thus, satisfies non-uniform modulation constraints, e.g., tighter constraints at the codeword boundaries or at some specified locations. Similarly, the eMTR code has a k-profile that may depend on the location n within a codeword.

Moreover, to achieve efficient encoding and decoding, the mtr-weights $v_n$ and $w_n$ can be selected to have a limited span S, i.e., in binary notation each mtr-weight has no more than S non-zero most significant bits with all lower bits being zero. More generally, the k-weights $v_n$ have a span $S^{(k)}$ and the j-weights $w_n$ have a (possibly different) span $S^{(j)}$. The finite span property ensures that the encoding/decoding can be done by one sliding-window $S^{(j)}$-bit adder (or subtractor) and one sliding-window $S^{(k)}$ bit-wide comparison for each encoded bit. In the following, we will always assume that j≤k and, moreover, typically $S^{(j)} \leq S^{(k)}$.

Tighter constraints at the boundaries can be enforced by selecting appropriate initial conditions and suitable lower and upper bounds for the input space. To obtain the tighter constraints at the codeword ending, $j_e<j$ and $k_e<k$, the initial conditions of the recursions are modified as follows:

$$v_n = \begin{cases} 0 & n = 1, 2, \ldots, k_e + 1 \\ 1 & n = k_e + 2, \ldots, k + 1 \end{cases} \quad (16)$$

-continued $$w_n = \begin{cases} 2^{n-1} & n = 1, 2, \ldots, j_e + 1 \\ \sum_{i=1}^{n-1} w_i - v_n & n = j_e + 2, \ldots, j + 1 \end{cases} \quad (17)$$

The mtr-weights are given by the two interlinked recursions:

$$v_{n+1} = 2^{n-S^{(k)}} \lfloor 2^{S^{(k)}-n}(v_{n-k} + w_{n-k}) \rfloor \; n = k+1, \ldots, N-1 \quad (18)$$

$$w_{n+1} = 2^{n-S^{(j)}} \lfloor 2^{S^{(j)}-n}(\sum_{i=n-j}^{n} w_i - v_{n+1} + v_{n-j}) \rfloor \; n = j+1, \ldots, N-1 \quad (19)$$

where $w_n = 0$ for $n \leq 0$ and where $\lceil t \rceil$ and $\lfloor t \rfloor$ denote the smallest integer, which is at least as large as t, and the largest integer not exceeding t, respectively. By construction, the j-weights have span $S^{(j)}$ and the k-weights have span $S^{(k)}$. To impose tighter constraints $j_b < j$ and $k_b < k$ at the beginning of codewords, one defines the upper and lower bounds on the input space as:

$$L_N = v_{N-k_b} + w_{N-k_b} \quad (20)$$

$$U_N = w_n + w_{n-1} + \ldots + w_{n-j_b} + v_{N-j_b} \quad (21)$$

The resulting code of length N includes $U_N - L_N$ codewords. The eMTR encoder is combined with an offset mapper to achieve the encoding of K input bits $u_1, u_2, \ldots, u_K$ into binary codewords $x_1, x_2, \ldots, x_N$ of length N, where $K = \lfloor \log_2(U_N - L_N) \rfloor$. Note that the offset mapper is essentially a binary $S^{(j)}$-bit adder with carry, which adds the first $S^{(j)}$ bits of the binary input sequence and the S most significant bits of the lower bound $L_N$.

Examples of good eMTR codes are presented below. We recall that all these eMTR codes are designed to be used with a $1/(1 \oplus D)$ precoder. To construct long eMTR codes, it is sufficient to specify the spans $S^{(j)}$ and $S^{(k)}$, the length N, the constraints j, k and the boundary constraints $j_b$, $j_e$ and $k_b$, $k_e$. Given these parameters the mtr-weights are fully determined by (16)-(21).

The previous recursions determine weights of limited span, which are of the form $v_n = 2^{n-1-S^{(k)}} A_n$, $A_n \leq 2^{S^{(k)}}$; $w_n = 2^{n-1-S^{(j)}} B_n$, $B_n \leq 2^{S^{(j)}}$.

The sequence $\{B_n\}$ is monotonically non-increasing. If $B_n < \frac{1}{2}$ for a large number of terms, then the representation is not efficient, i.e., these terms do not make use of the full span $S^{(j)}$.

A more efficient weight representation is obtained $$v_n = 2^{e(n)+1-S^{(k)}} A_n, \; A_n < 2^{S^{(k)}}$$

$$w_n = 2^{e(n)+1-S^{(j)}} B_n, \; B_n < 2^{S^{(j)}}$$

where the exponent e(n) of $w_n$ is given as $e(n) = \lfloor \log_2(w_{n-1} + w_{n-2} + \ldots + w_{n-j-1} - w_{n-k-1} - v_{n-k-1} + v_{n-j-1}) \rfloor$.

by:

The recursions are then given by:

$$v_{n+1} = 2^{e(n+1)+1-S^{(k)}} \lfloor 2^{S^{(k)}-e(n+1)-1}(v_{n-k} + w_{n-k}) \rfloor \; n = k+1, \ldots, N-1$$

$$w_{n+1} = 2^{e(n+1)+1-S^{(j)}} \lfloor 2^{S^{(j)}-e(n+1)-1}(\sum_{i=n-j}^{n} w_i - v_{n+1} + v_{n-j}) \rfloor \; n = j+1, \ldots, N-1$$

The following description provides illustrative eMTR codes in accordance with particular useful embodiments.

A. An eMTR(N=19; j=2; k=7) Code of Rate: 16/19. In Table I an eMTR code of length N=19 with mtr-weights $v_n$ and $w_n$ is specified. Table I also displays the j and k-profile. The tight constraints at the codeword boundaries ensure that the j=2 and k=7 constraints are maintained across codeword boundaries. The lower and upper bound on the input space U are $L_{19} = 8065$ and $U_{19} = 75482$. Therefore, the code contains 67417 codewords and gives raise to a rate: 16/19 block code. The capacity of the j=2, k=7 constraint is 0.873230 (rounded up to 6 decimal digits), which results in a rate efficiency of 96.4357%. Note that there exists no length-19 (j=2; k=6) code of rate 16/19.

TABLE I

Weights and constraints profile of an eMTR(N = 19, j = 2, k = 7) code of rate 16/19.

| | n | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| $w_n$ | 1 | 2 | 3 | 6 | 11 | 19 | 35 | 64 | 118 | 216 | 396 | 720 |
| $v_n$ | 0 | 0 | 0 | 0 | 0 | 1 | 1 | 1 | 1 | 2 | 3 | 6 |
| $j_n$ | 1 | 1 | 2 | 2 | 2 | 2 | 2 | 2 | 2 | 2 | 2 | 2 |
| $k_n$ | 1 | 2 | 3 | 4 | 4 | 5 | 6 | 7 | 7 | 7 | 7 | 7 |

| | n | | | | | | |
|---|---|---|---|---|---|---|---|
| | 13 | 14 | 15 | 16 | 17 | 18 | 19 |
| $w_n$ | 1312 | 2400 | 4352 | 8000 | 14592 | 26624 | 48640 |
| $v_n$ | 11 | 20 | 36 | 65 | 119 | 218 | 399 |
| $j_n$ | 2 | 2 | 2 | 2 | 2 | 2 | 1 |
| $k_n$ | 7 | 7 | 7 | 7 | 7 | 7 | 3 |

The k-weights $v_n$ have no limitation on their span and, thus, the encoder needs to perform comparisons operations that are up to N=19 bits wide. However, the j-weights $w_n$ have a span of $S^{(j)} = 7$. This implies that a bit error in the detector will not propagate through more than 7 bits at the modulation decoder output. Such reduced error propagation is a desirable property, which helps to reduce the byte error rate at the output of the modulation decoder.

The code satisfies an additional constraint—known as the twins-constraint (or t-constraint), which excludes quasi-catastrophic error propagation on a detector trellis for a partial response polynomial of the form $(1-D^2)(1-P(D))$, where $1-P(D)$ has no roots on the unit circle. In particular, the j=1 constraints at the codeword boundaries, enforces a twins constraint t=19. By eliminating the two sequences y1=1001100110011001100 and y2=0011001100110011001 from the code, one can enforce a t=17 constraint. The two sequences correspond to the input values $u_1 = 24824$ and $u_2 = 62216$. Hence, an encoder for this t=17 constraint code is obtained from the eMTR-encoder (7) by a simple modification, viz., the omission of $u_1$ and $u_2$ from the input space. To encode that eMTR(19, 2, 7) code with t=17 of rate 16/19, one can choose the input space to include all integers in the range $L_{19} \leq u \leq L_{19} + 2^{16} + 1$, except for the values $u_1$ and $u_2$. By deleting further codewords, the twins-constraint can be slightly tightened further; however, at a price of a more complex encoder/decoder.

B. Long eMTR Codes with j=7. The construction of long j=7 eMTR codes is based on (16)-(21). The codes are then uniquely determined by the following parameters: the two spans $S^{(j)}$ and $S^{(k)}$, length N, constraints j, k, and boundary constraints $j_b$, $j_e$ and $k_b$, $k_e$. These parameters are specified in Table II for various codes with k=7, 8 and 9. For all these codes the maximum length N is given such that the codes have rate (N-1)/N. For comparison purposes, the capacity of the constraint is also given with an accuracy of 4 decimal digits. The first and second codes satisfy the same constraints and both achieve essentially the same rate. The second code has a smaller j-span $S^{(j)}$ at the cost of a larger k-span $S^{(k)}$. The smaller j-span results in less error propagation at the decoder and also in smaller encoding/decoding complexity despite the larger k-span value. Similar comments apply to the forth and fifth code.

TABLE II

Parameters of long eMTR codes with j = 7 constraint and rate (N − 1)/N.

| $S^{(j)}$ | $S^{(k)}$ | k | $k_b$ | $k_e$ | j | $j_b$ | $j_e$ | N | rate | capacity |
|---|---|---|---|---|---|---|---|---|---|---|
| 13 | 13 | 7 | 3 | 4 | 7 | 3 | 4 | 129 | 0.9922 | 0.9942 |
| 12 | 17 | 7 | 3 | 4 | 7 | 3 | 4 | 130 | 0.9923 | 0.9942 |
| 11 | 11 | 8 | 4 | 4 | 7 | 3 | 4 | 168 | 0.9940 | 0.9957 |
| 11 | 11 | 9 | 4 | 5 | 7 | 3 | 4 | 202 | 0.9950 | 0.9964 |
| 10 | 14 | 9 | 4 | 5 | 7 | 3 | 4 | 200 | 0.9950 | 0.9964 |

C. Long eMTR Codes with j=6. The construction of long j=6 eMTR codes is based on (16)-(21). The codes are uniquely determined by the following parameters: the two spans $S^{(j)}$ and $S^{(k)}$ length N, constraints j, k, and boundary constraints $j_b$, $j_e$ and $k_b$, $k_e$. These parameters are specified in Table III for various codes with k=7, 8 and 9. The first two codes have rate (N−3)/N, while the last four codes have rate (N−1)/N. The dimension of the codes is denoted by K, i.e., each code has at least $2^K$ codewords. Again, for comparison purposes, the capacity of the constraint is given (with an accuracy of 4 decimal digits). The last code with $S^{(j)}$=9 is interesting from a complexity and error-propagation point of view.

TABLE III

Parameters of long eMTR codes with j = 6 constraint and rate K/N.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 13 | 13 | 7 | 3 | 4 | 6 | 3 | 3 | 301 | 298 | 0.9900 | 0.9912 |
| 12 | 15 | 7 | 3 | 4 | 6 | 3 | 3 | 300 | 297 | 0.9900 | 0.9912 |
| 11 | 11 | 8 | 4 | 4 | 6 | 3 | 3 | 100 | 99 | 0.9900 | 0.9927 |
| 10 | 14 | 8 | 4 | 4 | 6 | 3 | 3 | 100 | 99 | 0.9900 | 0.9927 |
| 11 | 11 | 9 | 4 | 5 | 6 | 3 | 3 | 113 | 112 | 0.9912 | 0.9934 |
| 9 | 10 | 9 | 4 | 5 | 6 | 3 | 3 | 102 | 101 | 0.9902 | 0.9934 |

D. Long eMTR Codes with j=5. The construction of two long j=5 eMTR codes is based on (16)-(21). The codes are uniquely determined by the following parameters: the two spans $S^{(j)}$ and $S^{(k)}$, length N, constraints j, k, and boundary constraints $j_b$, $j_e$ and $k_b$, $k_e$. These parameters are specified in Table IV. The maximum length N is given such that the first three codes have rate (N−3)/N, the fourth code has a rate (N−2)/N, and the last two codes have a rate (N−1)/N. The dimension of the codes is denoted by K, i.e., each code has at least $2^K$ codewords. Again, for comparison purposes, the capacity of the constraint is given (with an accuracy of 4 decimal digits). Note that the fourth code satisfies a k=10 constraint within the codeword and a j=11 constraint across codeword boundaries. Similarly, the last code satisfies k=18 and k=19 within codewords and at codeword boundaries, respectively.

TABLE IV

Parameters of long eMTR codes with j = 5 constraint and rate K/N.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 12 | 12 | 9 | 4 | 5 | 5 | 2 | 3 | 207 | 204 | 0.9855 | 0.9873 |
| 11 | 11 | 10 | 5 | 5 | 5 | 2 | 3 | 204 | 201 | 0.9853 | 0.9877 |
| 10 | 12 | 10 | 5 | 5 | 5 | 2 | 3 | 201 | 198 | 0.9851 | 0.9877 |
| 10 | 15 | 10 | 5 | 6 | 5 | 2 | 3 | 136 | 134 | 0.9853 | 0.9879 |
| 10 | 15 | 14 | 7 | 7 | 5 | 2 | 3 | 64 | 63 | 0.9844 | 0.9880 |
| 10 | 14 | 18 | 9 | 10 | 5 | 2 | 3 | 65 | 64 | 0.9846 | 0.9881 |

The construction of long, high-rate PRML(G, I, M) modulation codes for partial-response maximum-likelihood (PRML) recording schemes from long, high-rate MTR codes will be described. Also, the implementation aspects of MTR encoders/decoders are disclosed.

In computer data storage, Partial Response Maximum Likelihood (PRML) detection is a method for converting weak analog signals from a head of a magnetic disk or tape drive into a digital signal. The PRML technique takes the intersymbol interference (ISI) of the recording channel into account and attempts to correctly interpret even small changes in the analog signal by using a viterbi detector to optimally decode entire bit sequences rather than individual bits. Because a PRML decoder takes the IST of the recoding channel into account and because it can correctly decode a weaker signal, it permits higher density recording.

High-Rate PRML(G, I, M) Codes: In partial-response maximum-likelihood (PRML) based recording systems, one uses PRML(G, I) modulation codes, which satisfy (i) a global run-length constraint for synchronization purposes, and (ii) a run-length constraint in the even and the odd interleave allowing one to use a short path memory in a viterbi detector without a substantial performance degradation. Recall that PRML(G, I) codes are used with a $1/(1 \oplus D^2)$ precoder and that the (G, I)-constraints are defined prior to the precoder. Namely, the maximum number of consecutive zeros in the coded binary sequences is limited to G and the maximum number of consecutive zeros in both the even and odd interleaves of the coded sequences is limited to I. By using an eMTR(N, j, k) code in both the even and odd interleave, one obtains a PRML(G, I) code with G=2k and I=k. The j constraint in each interleave translates into the M constraint. This is a constraint that limits the runs of alternating 2T magnets . . . ++−−++−− . . . in channel input sequences (i.e., after preceding) to $\lfloor M/2 \rfloor+1=j+1$, where T denotes the symbol duration.

In the context of anti-whistle codes, an equivalent constraint is referred to as $k_4^a$ constraint. We denote PRML codes, which are constructed from eMTR(N, j, k) codes, as PRML(G, I, M) codes to emphasize the three constraints G=2k, I=k and M=2j. The M constraint is also known as VFO (variable-frequency oscillator) constraint. It is a desirable constraint in tape recording systems, which employ a phase-locked loop (PLL) that acquires phase lock based on a long alternating 2T VFO pattern. The VFO constraint ensures that there is no modulation encoded data sequence, which is mistaken for a long VFO pattern.

In addition to the (G, I, M) constraints, the resulting PRML (G, I, M) codes satisfy further constraints, which are known as $k_2$ and $k_4^b$ constraints. The $k_2$ constraint limits the length of alternating channel input sequences . . . +−+−+− . . . and the $k_4^b$ constraint limits the length of channel input sequences of period 4 of the form . . . +++−+++− . . . or their antipodal version. Thus, PRML(G, I, M) codes, which are derived from eMTR(N, j, k) codes, satisfy k, $k_2$, $k_4^a$ and $k_4^b$ constraints, i.e., these PRML(G, I, M) codes limit the length of all periodic channel input sequences of period 1, 2 and 4. The constraints are related by k=G+1, $k_2$=2I+1, $k_4^a$=M+1 and $k_4^b$=2I+2.

The two-way interleaving construction based on eMTR(N, j, k) codes results in PRML(G, I, M) codes of length 2N. These PRML codes are chosen to have even dimension, say 2(N−1), and the 2(N−1) input bits are split into an even and odd bit sequence of N−1 bits each and then encoded by the eMTR encoders in both interleaves. By using a prefix encoder, one can also allow an odd number of input bits for the PRML(G, I, M) code. In this case, prior to the eMTR encoding, the input bit sequence is partitioned into two bit streams by the prefix encoder and, then, each of the two bit streams is separately encoded by the two eMTR encoders in the even and odd interleave. The corresponding eMTR codes have the appropriate number of codewords. E.g., if the 2N−1-bit input stream is partitioned into two equal parts, each eMTR code has at least $2^{(2N-1)/2}$ codewords. Examples of such constructions will be given below.

A. Long High-Rate PRML(G=14, I=7, M) Codes: To construct PRML(G=14, I=7, M) codes from the eMTR codes with j=7, as given in Table II, one applies bit inversion to the eMTR codes, which transforms an eMTR(N, j=7; k=κ) into an eMTR(N, j=κ; k=7) code with dual constraints. Since bit inversion is applied, the M constraint of the PRML(G=14, I=7) codes is M=2k, where k refers to the k constraint of the underlying eMTR code in Table II. In this way, the five codes in Table II give rise to five PRML(G=14, I=7, M) codes of rate (2N−2)/2N with M constraints 14, 14, 16, 18 and 18, respectively.

By using a prefix encoder, one can construct a rate-207/208 PRML(G=14, T=7, M=22) code, which in the even and odd interleave uses the bit-inverted eMTR code specified in Table V. Note that this eMTR code has a fractional dimension K=103.5, which means that it includes at least $2^{103.5}$ codewords.

TABLE V

Parameters of an eMTR(N = 104; j = 7; k = 11) code with at least $2^{103.5}$ codewords.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 9 | 12 | 11 | 5 | 6 | 7 | 3 | 4 | 104 | 103.5 | 0.9952 | 0.9970 |

B. Long High-Rate PRML(G=12, I=6, M) Codes: In a similar way as above, one can construct PRML(G=12, I=6) codes from the eMTR codes with j=6 in Table III. The resulting six codes are PRML(G=12, I=6, M) codes with M=14, 14, 16, 16, 18 and 18 and rates 596/602, 594/600, 198/200, 198/200, 224/226 and 202/204, respectively.

The following five PRML(G=12, I=6, M) codes are derived from the interleaving construction in conjunction with a prefix encoder. The even and odd interleaves of these PRML codes are eMTR codes, which are determined by the parameters in Table VI and equations (16)-(21). The resulting PRML codes have length 2N and dimension 2K.

TABLE VI

Parameters of long eMTR codes with j = 6 constraint and at least $2^K$ codewords.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 11 | 15 | 10 | 5 | 5 | 6 | 3 | 3 | 50 | 49.5 | 0.9900 | 0.9938 |
| 12 | 12 | 10 | 5 | 5 | 6 | 3 | 3 | 50 | 49.5 | 0.9900 | 0.9938 |

TABLE VI-continued

Parameters of long eMTR codes with j = 6 constraint and at least $2^K$ codewords.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 12 | 12 | 10 | 5 | 5 | 6 | 3 | 3 | 204 | 202.5 | 0.9926 | 0.9938 |
| 11 | 16 | 11 | 6 | 7 | 6 | 3 | 3 | 56 | 55.5 | 0.9911 | 0.9942 |
| 9 | 11 | 12 | 6 | 6 | 6 | 3 | 3 | 50 | 49.5 | 0.9900 | 0.9941 |

C. Long High-Rate PRML(G=10, I=5, M) Codes: In a similar way as above, one can construct PRML(G=10, I=5, M) codes from the eMTR codes with j=5 in Table IV. The resulting six PRML(G=10, I=5, M) codes have rates 408/414, 402/408, 396/402, 268/272, 126/128 and 128/130, and M-constraints 18, 20, 20, 22, 28 and 38 respectively. Two further PRML(G=10, I=5, M) codes of length 2N=200 and dimension 2N−3=197 are obtained from the interleaving construction in conjunction with a prefix encoder. The underlying eMTR(N=100, j=5, k) codes are uniquely determined by the eight left most parameters in Table VII.

The codes include more than $2^{98.5}$ codewords. The first code satisfies a uniform k=11 constraint within codewords and a k=12 constraint at the codeword boundary, while the second code satisfies an overall k=11 constraint.

TABLE VII

Parameters of two long eMTR codes with j = 5 constraint and at least 2K codewords.

| $S^{(j)}$ | $S^{(k)}$ | k | $k_b$ | $k_e$ | j | $j_b$ | $j_e$ | N | K | rate | capacity |
|---|---|---|---|---|---|---|---|---|---|---|---|
| 11 | 11 | 11 | 6 | 6 | 5 | 2 | 3 | 100 | 98.5 | 0.9850 | 0.9880 |
| 10 | 15 | 11 | 5 | 6 | 5 | 2 | 3 | 100 | 98.5 | 0.9850 | 0.9879 |

Referring now to the drawings in which like numerals represent the same or similar elements and initially to FIG. 1, an eMTR encoder/decoder system 100 is shown in accordance with one illustrative embodiment. A transmitter or data source 120 includes an encoder 104 configured to provide EMTR encoding in accordance with the present principles. The encoder 104 include a memory unit 103 configured to store two sets of weights including j-weights 106 $\{w_n\}$ and combined k-weights 108 and j-weights 106 $\{v_n+w_n\}$, each set including N elements. The encoder 104 includes computation module 105 configured to receive the two sets of weights and works in N steps, m=1, 2, . . . , N, to produce an N-bit output sequence by setting an updated input sequence equal to the offset input word and at step in compares if the updated input sequence exceeds the N−m+1-th term of the combined weights $\{v_n+w_n\}$, if so, the m-th output bit is set to a first bit value and the N−m+1-th j-weight $w_{N-m+1}$ is subtracted from the updated input sequence; and otherwise, the m-th output bit is set to a second bit value and the updated input sequence is passed unchanged to the next step.

The eMTR codes are designed to be fully characterized by two sets of weights. A first set of weights 106, which are called the j-weights, determine the j-constraint and a second set of weights 108, which are called the k-weights, determine the k-constraint of the corresponding MTR code. Given a set of j-weights 106 and the k-weights 108, the enumerative MTR encoder 104 maps input bits 101 into (j, k)-constrained codewords of the MTR code. A mapper 102 adjusts the input bits in accordance with lower bound as will be explained below.

The encoder 104 transmits the encoded information on a recording channel or transmission media 130. This may include a wired or wireless connection or channel or may include a network or networks. A receiver or data sink 122 receives the encoded bits. A detector 108 is employed to detect the signal. Magnetic recording and optical storage, modulation constraints are employed on recorded binary sequences to facilitate timing recovery and ensure efficient operation of the detector 108.

An eMTR decoder 110 decodes the bits in accordance with the j-weights 106 and outputs the bits to a demapper 112 to reproduce the input bits in an output stream 111.

It should be understood that the transmission portion 120 and the receive portion 122 may be located on a same device, on separate devices, on devices remotely disposed from each other but communicating over a network or the like.

The eMTR codes have some similarities with Fibonacci codes. Fibonacci codes do not include a k constraint. More specifically, if one selects k=N and $k_e$=N in the generalized recursions (16), (17), (18) and (19), then the k-weights 108 $\{v_n\}$ are all zero and the resulting eMTR(N, j, k=N) code may be considered a generalized Fibonacci code. In particular, the Fibonacci code is fully determined by the j-weights $\{w_n\}$. In accordance with the present principles, the EMTR encoder 104 may employ, e.g., Eq. (7) for encoding the input bits 101, and the eMTR decoder 110 may employ, e.g., Eq. (9) for decoding the encoded bits.

For a nontrivial k constraint, the eMTR codes are characterized by the two sets of weights, the k-weights $\{v_n\}$ 108 and j-weights $\{w_n\}$ 106.

For a nontrivial k constraint, the eMTR encoder/decoder methods are different from the Fibonacci encoders/decoders. The Fibonacci encoders/decoders need to store the j-weights only, whereas the eMTR encoders/decoders need to store the j-weights and the combined weights $\{v_n+w_n\}$, n=1, 2, ..., N. Thus, the memory requirement for eMTR codes is about twice as large as that for generalized Fibonacci codes. When working with the j-weights and the combined weights, the operational complexity of the eMTR encoders/decoders is advantageously about the same as that of Fibonacci encoders/decoders.

Both encoders and decoders can be implemented by sliding-window algorithms of window length max $\{S^{(j)}, S^{(k)}\}$. In particular, the encoding of Eq. (7) of a codeword bit $x_l$ at the l-th step employs an $S^{(k)}$-bit wide comparison and one subtraction of two $S^{(j)}$-bit wide numbers. At the decoder using Eq. (9), each processed bit needs one $S^{(j)}$-bit wide addition with carry.

Numerous examples presented above of long high-rate eMTR codes illustrate the efficiency of these codes. Two-way interleaving of bit-inverted eMTR(N, j, k) codes gives rise to PRML(G=2j, I=j, M=2k) codes. Such long high-rate PRML (G, I, M) codes are suitable for reverse concatenation architectures with partial symbol interleaving in tape/optical recording and recording systems for hard disk drives. Although the presented code examples are essentially limited to codes with uniform modulation constraints, one can easily construct codes with non-uniform constraints as for the class of generalized Fibonacci codes. For codes with uniform and non-uniform constraints, the same general code design method applies.

There are important structural differences between Fibonacci encoders and eMTR encoders, namely, the eMTR encoders need a preliminary offset mapper 102 to account for the fact that the input space is in the range $L_N \leq u < U_N$, where the lower bound is strictly positive for a nontrivial k constraint, i.e., for k<N. The complexity of this offset mapper 102 amounts to one $S^{(j)}$-bit wide addition with carry, which is a very minor increase in the operational complexity of the overall eMTR encoder 104. Similarly, at the decoder side 122, a corresponding offset demapper 112 is needed, which subtracts the lower bound $L_N$ from the bit stream generated by the decoding.

The eMTR decoder 110 provides for the inverse mapping. The weights 106 and 108 were chosen at the encoder to support efficient encoding/decoding and to ensure limited error propagation at the decoder when this becomes an issue, i.e., for moderately long and long codes. The decoder 110 may include memory 109 and a computation unit 113 to perform decoding tasks. The new class of MTR codes is capacity-efficient, i.e., one can achieve code rates that are close to the capacity of the given (j, k)-constraint for moderately long and long code lengths N, say N≧17.

The class of MTR block codes has been characterized by two sets of weights, the j-weights and the k-weights. These weights are preferably determined by two recursion formulae, which reflect the predetermined j and k constraints. These eMTR codes have efficient enumerative encoding/decoding with limited error propagation at the decoder. These encoders/decoders are similar to generalized Fibonacci codes, except for an additional simple offset mapper 102 or 112, which accounts for the fact that the enumeration does not start at zero but at some positive offset. Numerous examples of long high-rate eMTR codes illustrate the efficiency of these codes. Although the presented code examples are essentially limited to codes with uniform modulation constraints, one can easily construct codes with non-uniform constraints as illustrated for the class of generalized Fibonacci codes. For codes with uniform and non-uniform constraints, the same general code design method may apply.

Figure 2:
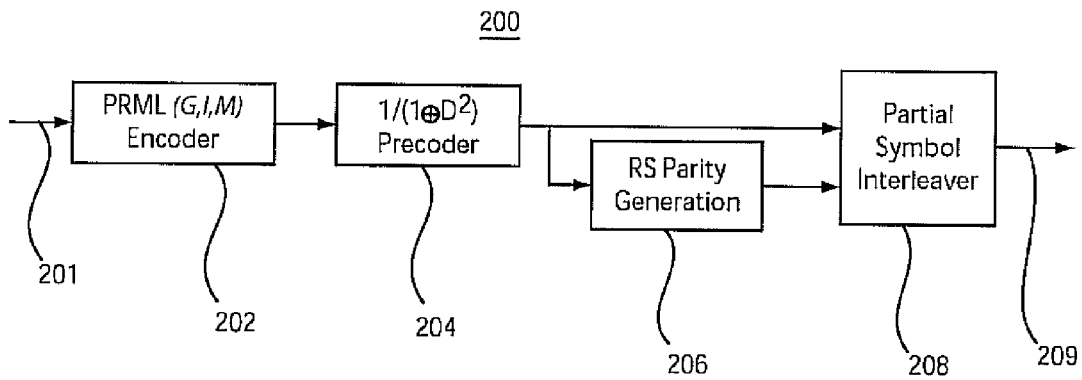
FIG. 2 is a block/flow diagram showing an PRML(G, I, M) encoder used with partial symbol interleaving of ECC parity symbols.

Referring to FIG. 2, a block/flow diagram showing a system/method 200 for long high-rate PRML-codes suited for reverse concatenation (RC) for applying partial symbol interleaving. System 200 includes an encoder 202 which employs a new class of long PRML(G, I, M) codes employed for encoding input bits 201. The PRML(G, I, M) codes are capacity-efficient, i.e., one can achieve code rates that are close to the capacity of the given (G, I, M)-constraint (see, e.g., Tables V-VII above).

The PRML(G, I, M) codes are employed in conjunction with a $1/(1 \oplus D^2)$ precoder 202. Note that the G, I and M constraints are defined prior to preceding. The precoder 204 precodes the bit stream. The bit stream is provided to a Reed-Solomon (RS) parity generator 206 and to a partial symbol interleaver 208. The partial symbol interleaver 208 interleaves the data with parity symbols with the precoded bits to output a partially interleaved bit stream 209. The long high-rate PRML-codes are well suited for applying partial symbol interleaving and for reverse concatenation (RC) schemes.

In magnetic and optical recording systems, modulation codes are employed to enforce modulation constraints, which are needed for timing recovery and efficient operation of a detector during read-back. Effective constraints, which may be employed, include a global G-constraint, i.e., a code sequence includes no more than G consecutive zeros, and the interleaved I-constraint, which means that in the even and the odd interleave there can be at most I consecutive zeros.

For these (G, I)-constraints, there is a large class of codes PRML(G, I), called interleaved generalized Fibonacci codes, which can be efficiently encoded and which are highly efficient in terms of capacity. In tape recording systems and all other systems, which employ a phase-locked loop (PLL) that acquires phase lock based on a long alternating 2T VFO patterns, it is desirable to impose an M constraint (also known as VFO constraint). This is a constraint that limits the runs of alternating 2T magnets, e.g., . . . ++−−++−− . . . of the channel input sequences (after precoding) to at most M/2+1.

PRML(G, I) codes that are based on interleaved Fibonacci codes fail to impose an M-constraint when used in combination with a $1/(1 \oplus D^2)$ precoder. In this disclosure, the PRML (G, I, M) codes are constructed from eMTR codes, which depend on two parameters j and k and, thus, the resulting PRML(G, I, M) codes (after bit-inversion) have parameters G=2j, I=j and M=2k. Therefore, the construction in accordance with the present principles enforces an M constraint in addition to the G and I constraints. If the bit-inverted, interleaved Fibonacci codes with a predetermined j constraint were used in combination with a $1/(1 \oplus D^4)$ precoder, the resulting sequences would satisfy the constraints G=2(j+1), I=j+1 and M=2(j+1). Thus, using a $1/(1 \oplus D^4)$ precoder results in weaker global and interleaved constraints of G=2(j+1) and I=j+1 rather than G=2j and I=j for the usual $1/(1 \oplus D^2)$ precoder. Therefore, the construction in accordance with the present principles provides more flexibility in the selection of the M constraint and results in tighter G and I constraints for the same j-parameter, which is one important feature. E.g., for a given j-parameter, which determines the constraints G=2j and I=j, the new class of PRML(G, I, M) codes can achieve higher code rates.

A new class of PRML(G, I, M) codes is designed, which is derived from eMTR(N, j, k) codes. Given an eMTR(N, j, k) code, i.e., an enumerative maximum-transition-run (eMTR) code of length N satisfying a j and a k constraint, one can construct a PRML code by using the eMTR(N, j, k) code in the even and odd interleave. The resulting PRML(G, I, M) code has parameters I=k, G=2k and M=2j. This new class of PRML(G, I, M) codes is a generalization of the interleaved generalized Fibonacci codes and their encoders/decoders have comparable complexity. The new class of long PRML (G, I, M) codes is capacity-efficient, i.e., one can achieve code rates that are close to the capacity of the given (G, I, M)-constraint.

Figure 3:
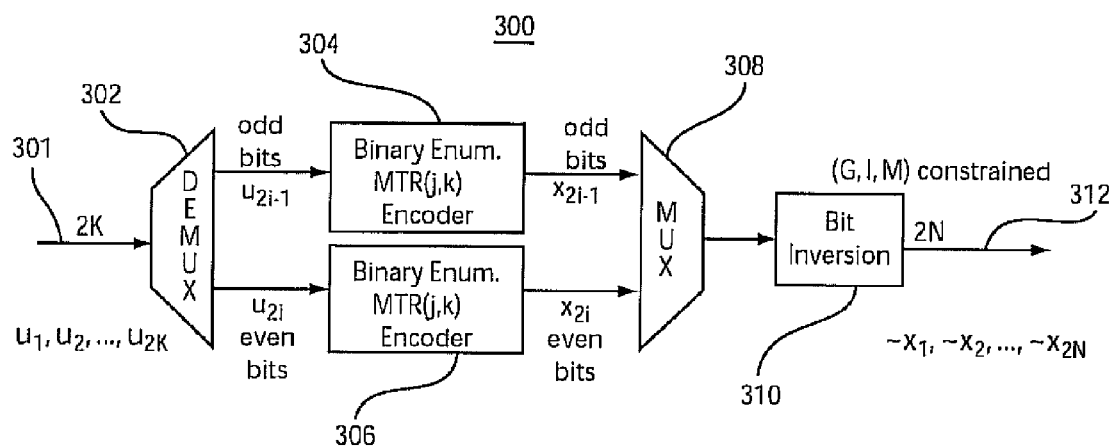
FIG. 3 is a block/flow diagram showing an encoder employing a PRML(G, I, M) code in accordance with one illustrative embodiment.

Referring to FIG. 3, an efficient encoder system 300 for a new class of PRML(G, I, M) codes, which are based on interleaved eMTR codes, is shown in accordance with one illustrative application. Given eMTR(N, j, k) code of dimension K and rate K/N (assuming j≦k), construction of a rate-(2K)/(2N) PRML(G=2j, I=j, M=2k) code based on even/odd interleaving and bit-inversion is provided. The encoder system 300 includes a demultiplexer 302 which receives an even number (2K) input bits 301 ($u_1, u_2, \ldots, u_{2K}$) and separates the input bits into odd bits ($u_{2i-1}$) and even bits ($u_{2i}$). Binary eMTR encoder 304 receives the odd input bits and encodes them using eMTR codes employing j-weights and k-weights to output encoded bits ($x_{2i-1}$). Binary eMTR encoder 306 receives the even input bits and encodes them using eMTR codes employing i-weights and k-weights to output encoded even bits ($x_{2i}$).

A multiplexer 308 combines the encoded odd and even bits and outputs the encoded bits to a bit inverter 310. The bits are inverted to output codewords of length 2N (even number of bits in the output codeword) that are (G, I, M) constrained to provide a PRML(G, I, M) code. Note ~x denotes the inverse of bit x.

The k constraint of the eMTR(j, k) code in the interleaved eMTR encoding provides the M constraint for the output sequence 312, which is bit-inverted. The j constraint of the eMTR(j, k) code in the interleaved eMTR encoding provides G and I constraints for the output sequence 312, which is bit-inverted.

It should be noted that enumerative MTR codes in the even and odd interleave need not necessarily be the same. E.g., if one uses an eMTR(N, $j_{even}$, $k_{even}$) code in the even interleave encoder 304 and an eMTR(N, $j_{odd}$, $k_{odd}$) code in the odd interleave encoder 306, the resulting PRML code (after bit-inversion) has parameters G=min$\{2j_{even}, 2j_{odd}\}$, I=max$\{j_{even}, j_{odd}\}$, M=min$\{2k_{even}, 2k_{odd}\}$.

Figure 4:
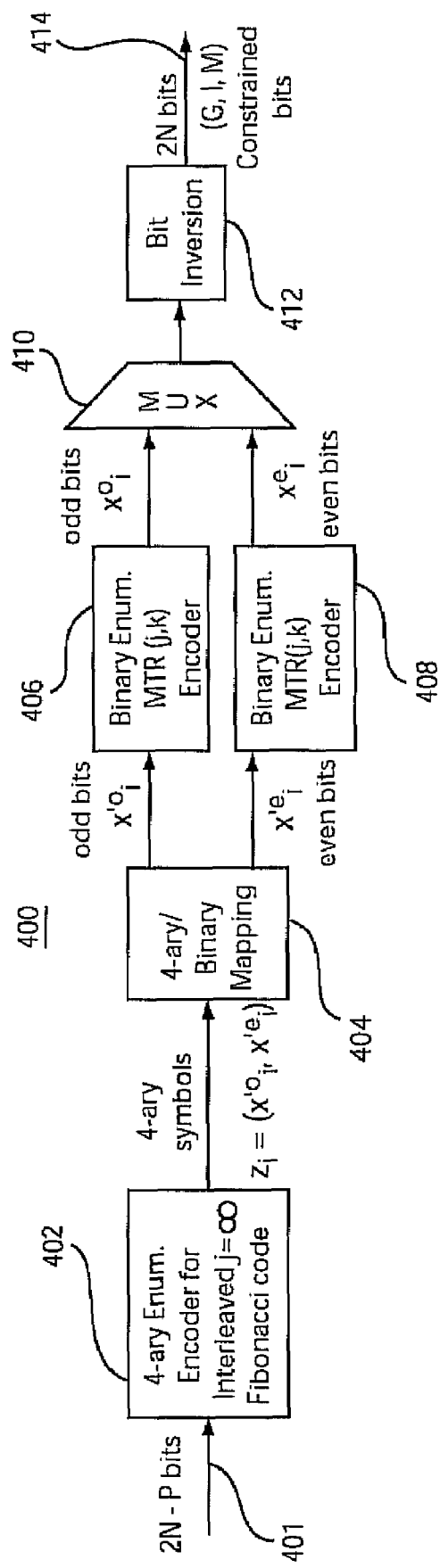
FIG. 4 is a block/flow diagram showing another encoder employing a PRML(G, I, M) code in accordance with another illustrative embodiment.

Referring to FIG. 4, another efficient encoder system 400 for a new class of PRML(G, I, M) codes, which are based on interleaved eMTR codes, is shown in accordance with another illustrative application. Given an eMTR(j, k) code of length N and of fractional dimension K, i.e., with at least $2^K$ codewords, a rate-(2K)/(2N) PRML(G=2j, I=j, M=2k) code can be constructed with 2K=2N−P, P an odd number, based on input splitting, even/odd interleaving and bit-inversion.

The encoder system 400 includes a prefix encoder (e.g., 4-ary enumerative encoder) 402 for an interleaved j=∞ Fibonacci code which achieves a splitting of 2N−P input bits 401, where P is an odd number, into a length-N' array $[z_1, \ldots, z_{N'}]$ of 4-ary symbols. A 4-ary to binary mapper 404 is employed to form two binary sequences $[x'^e_1, x'^e_2, \ldots, x'^e_{N'}]$ and $[x'^o_1, x'^o_2, \ldots, x'^o_{N'}]$, which are inputs for the even and odd eMTR encoders 408 and 406, respectively. Other input splitting techniques may be employed, e.g., based on a short block encoder, etc.

Binary eMTR encoder 406 receives the odd input bits and encodes them using eMTR codes employing j-weights and k-weights to output encoded bits $x^o_i$, i=1, . . . , N. Binary eMTR encoder 408 receives the even input bits and encodes them using eMTR codes employing j-weights and k-weights to output encoded even bits $x^e_i$, i=1, . . . , N.

A multiplexer 410 interleaves the encoded odd and even bits and passes the interleaved bits to a bit inverter 412. The bits are inverted to produce output codewords of length 2N that are (G, I, M) constrained to provide a PRML(G, I, M) code.

The k constraint in the interleaved eMTR encoding provides the M constraint for the output sequence 414. The j-constraint in the interleaved eMTR encoding provides G and I constraints for the output sequence 414.

It should be noted that enumerative MTR codes in the even and odd interleave need not necessarily be the same. E.g., if one uses an eMTR(N, $j_{even}$, $k_{even}$) code in the even interleave encoder 408 and an eMTR(N, $j_{odd}$, $k_{odd}$) code in the odd interleave encoder 406, the resulting PRML code has parameters G=min$\{2j_{even}, 2j_{odd}\}$, I=max$\{j_{even}, j_{odd}\}$, M=min$\{2k_{even}, 2k_{odd}\}$.

Figure 5:
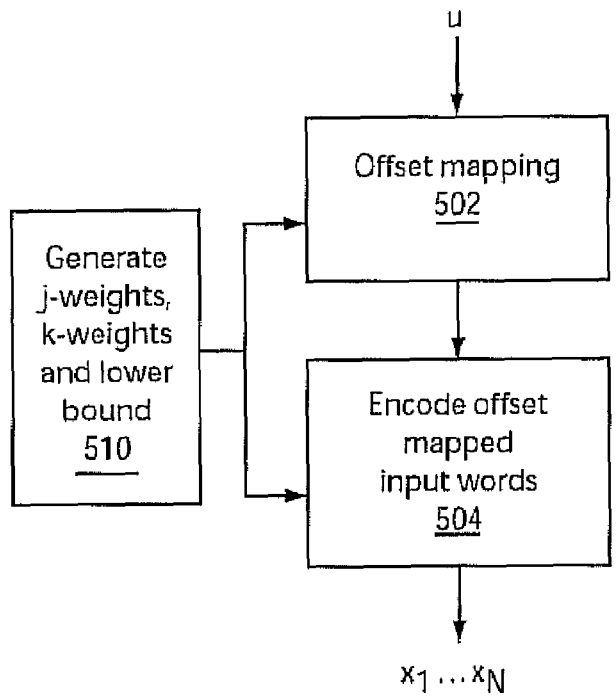
FIG. 5 is a block/flow diagram showing an encoder method in accordance with one illustrative embodiment.

Referring to FIG. 5, a block/flow diagram showing a system/method for encoding data using enumerative MTR codes for encoding a stream of K-bit input words into a stream of modulation constrained N-bit words. In block 502, offset mapping is performed on received input words to add a fixed binary sequence $L_N$ to every input word, to produce an offset input word.

In block 502, each input word $u_1, u_2, \ldots, u_N$, is offset by an offset value $L_N$, which is provided by block 510. The offset mapping adds the offset $L_N$ to the sum $$\sum_{i=1}^{N} u_i 2^{N-i}$$

by an assignment $$u = \sum_{i=1}^{N} u_i 2^{N-i} + L_N$$

to produce an offset input word u.

In block 504, every offset input word is encoded or transformed into an N-bit (j, k)-constrained word. The encoding is based on two sets of weights, namely, j-weights $\{w_n\}$ and combined weights of k-weights and j-weights $\{v_n+w_n\}$, each set of weights including N elements, which are supplied by block 510. Working in N steps, m=1, 2, ..., N, an N-bit output sequence $x_1, \ldots, x_N$ is produced. The encoding starts by setting an updated input sequence equal to the offset input word and at step m compares if the updated input sequence exceeds the N−m+1-th term of the combined weights $\{v_n+w_n\}$, if so, the m-th output bit is set to a first bit value and the N−m+1-th j-weight $w_{N-m+1}$ is subtracted from the updated input sequence and, otherwise, the m-th output bit is set to a second bit value and the updated input sequence is passed unchanged to the next step. More specifically, this may include given an offset input word u, computing a binary output sequence $x_1, x_2, \ldots, x_N$ based on: for m=1 to N do if $u \geq v_{N-m+1}+w_{N-m+1}$, then $x_m=1$, $u=u-w_{N-m+1}$ else
   $x_m=0$                                                      (7).

In block 510, the j-weights and the k-weights are determined to ensure that the codewords satisfy predetermined (j, k) modulation constraints. These weights are selected in a manner to provide a desirable level of encoding/decoding efficiency and a reduced level of error propagation. The weights are preferably determined in advance during a design phase of the code but they might also be computed on the fly during operation of the encoder/decoder. Given predetermined parameters such as the length N of the code, the j-constraint, the k-constraint, the boundary constraints at the beginning and end of a codeword $j_b, k_b$ and $j_e, k_e$, these j-weights and k-weights are determined such that they satisfy initial conditions and linear recursions. The initial conditions include $v_n \geq 0$ for n=1, 2, ..., k+1 (10) and $w_n \leq 2^{n-1}$ for n=1, 2, ..., j+1 (11). The linear recursions may include: $v_{n+1} \geq v_{n-k}+w_{n-k}$ for n≥k+1 (12) and $w_{n+1} \leq w_n+w_{n-1}+ \ldots +w_{n-j}-v_{n+1}+v_{n-j}$ for n≥j+1 (13). The input space for a code of length N is determined by a lower and an upper boundary $L_N$ and $U_N$, respectively, which are given by: $L_N \geq v_{N-k}+w_{N-k}$ (14) and $U_N \approx w_N+w_{N-1}+\ldots+w_{N-j}+v_{N-j}$ (15). Illustrative examples are described above.

Figure 6:
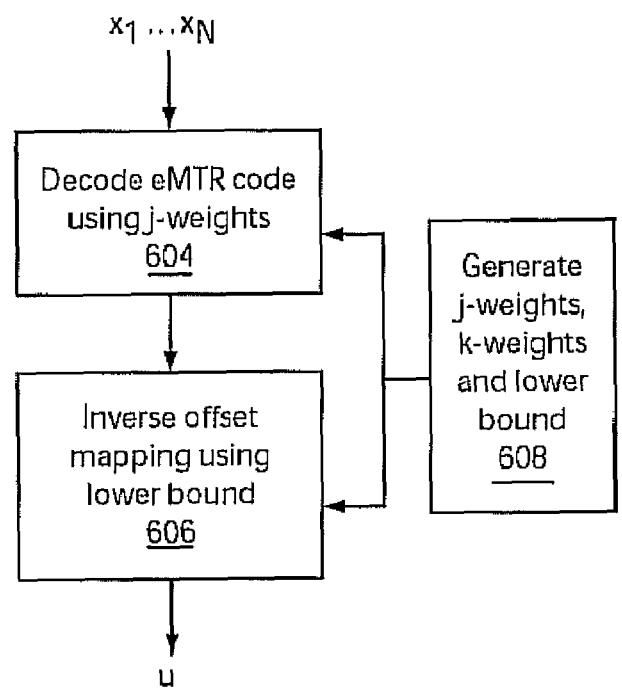
FIG. 6 is a block/flow diagram showing a decoder method in accordance with one illustrative embodiment.

Referring to FIG. 6, a block/flow diagram showing a system/method for decoding data with enumerative MTR codes. Block 604 performs the inverse operation of block 504. Given a maximum transition run codeword $x_1, x_2, \ldots, x_N$, the corresponding offset input word u is determined based on enumerative encoding techniques. Note that, in general, the decoder input $x_1, x_2, \ldots, x_N$ is a length-N bit sequence, which is not necessarily an eMTR codeword. Nevertheless, in both cases, the output of block 604 is initialized to u=0 and the following N steps are performed: for n=1 to N: if $x_{N-n+1}=1$ then $u=u+w_n$ (9). Here $w_n$ represents j-weights of the MTR code of length N, which are supplied by block 608.

In block 606, inverse offset mapping is performed including using a lower bound $L_N$ of an input space, which is provided by block 608. The inverse offset mapping includes subtracting the offset $L_N$ from u to produce the binary word $u_1, u_2, \ldots, u_N$ from $$\sum_{i=1}^{N} u_i 2^{N-i} = u - L_N.$$

Block 608 is the counterpart to block 510, namely, it determines the same j-weights and k-weights of an MTR(j, k) code of length N used for encoding. The weights are preferably determined in advance during a design phase of the code but they might also be computed on the fly during operation of the encoder/decoder. Given predetermined parameters such as the length N of the code, the j-constraint, the k-constraint, the boundary constraints at the beginning and end of a codeword $j_b, k_b$ and $j_e, k_e$, these j-weights and k-weights are determined such that they satisfy initial conditions and linear recursions. The initial conditions include $v_n \geq 0$ for n=1, 2, ..., k+1 (10) and $w_n \leq 2^{n-1}$ for n=1, 2, ..., j+1 (11). The linear recursions may include: $v_{n+1} \geq v_{n-k}+w_{n-k}$ for n≥k+1 (12) and $w_{n+1} \leq w_n+w_{n-1}+ \ldots +w_{n-j}-v_{n+1}+v_{n-j}$ for n≥j+1 (13). The input space for a code of length N is determined by a lower and an upper boundary $L_N$ and $U_N$, respectively, which are given by: $L_N \geq v_{N-k}+w_{N-k}$ (14) and $U_N \leq w_N+w_{N-1}+ \ldots + w_{N-j}+v_{N-j}$ (15). Illustrative examples are described above.

Figure 7:
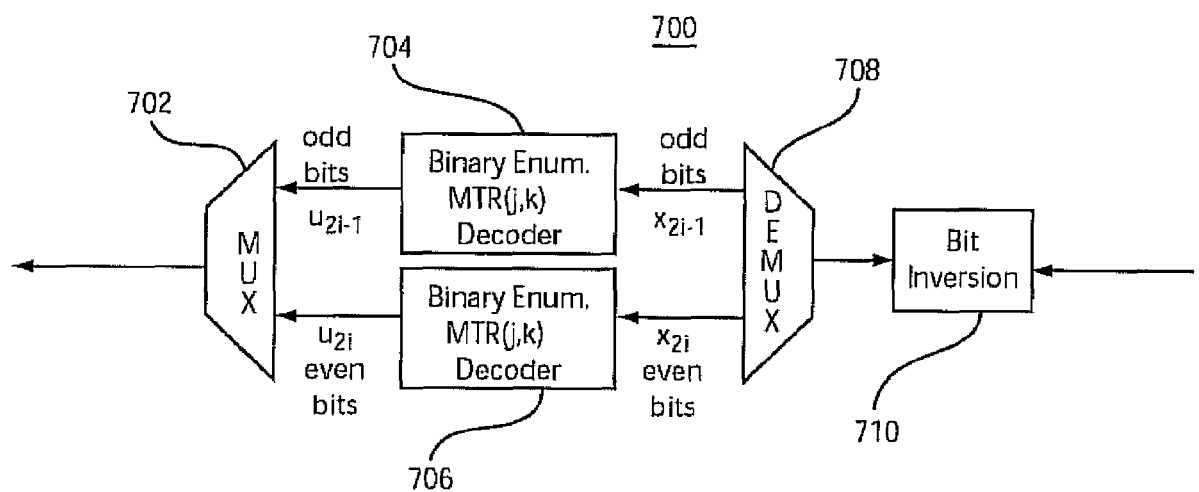
FIG. 7 is a block/flow diagram showing a decoder for decoding a PRML(G, I, M) code in accordance with one illustrative embodiment.

Referring to FIG. 7, an efficient decoder system 700 for the new class of PRML(G, I, M) codes, which are based on interleaved eMTR codes, is shown in accordance with one illustrative application. This decoding system 700 for the PRML(G, I, M) codes is the reverse of the encoding system 300. A bit inverter 710 inverts all bits of the decoder input stream, which consists of a stream of words of length 2N. A bit splitter 708 is configured to separate input bits into an even and odd interleave. The bit splitter 708 may include a demultiplexer. Two enumerative maximum transition run (eMTR) decoders 706 and 704 are connected to each path and configured to employ j-weights to map the decoder input bits into eMTR decoder output bits by applying the j-weights to provide output bits with a reduced level of error propagation.

It should be noted that enumerative MTR codes in the even and odd interleave need not necessarily be the same. E.g., if one uses an eMTR(N, $j_{even}, k_{even}$) code in the even interleave decoder 706 and an eMTR(N, $j_{odd}, k_{odd}$) code in the odd interleave decoder 704. A multiplexer 702 combines the decoded odd and even bits and outputs the decoded bits.

Having described preferred embodiments of systems and methods for enumerative encoding and decoding of maximum-transition-run codes (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for encoding a stream of K-bit input sequences into a stream of (G, I, M)-constrained 2N-bit output sequences, comprising:
    transforming each K-bit input bit sequence into two separate data paths including even and odd bits;
    enumerative maximum-transition-run (eMTR) encoding the even bits to generate constrained even bits;
    enumerative maximum-transition-run (eMTR) encoding the odd bits to generate constrained odd bits; and interleaving the constrained even and constrained odd bits to form a stream of (G, I, M)-constrained 2N-bit output sequences where G is a global constraint, I is an interleaved constraint, and M is a variable frequency oscillator constraint of a partial-response maximum-likelihood (PRML) code.

2. The method as recited in claim 1, wherein transforming includes demultiplexing input bits into an even bit sequence and an odd bit stream in case K is an even number.

3. The method as recited in claim 1, wherein transforming includes splitting input bits into an even bit sequence and an odd bit sequence using a prefix encoder and mapper.

4. The method as recited in claim 1, further comprising applying bit inversion to eMTR encoded bits.

5. The method as recited in claim 1, wherein the steps of eMTR encoding include offsetting input bits by a lower bound of an input space in accordance with the j-weights and the k-weights.

6. The method as recited in claim 1, wherein the eMTR encoding is based on two sets of weights, j-weights $\{w_n\}$ and k-weights $\{v_n\}$, which determine a maximum transition run (MTR) code with pre-determined j and k constraints wherein $j \leq k$.

7. The method as recited in claim 6, wherein the j-weights and the k-weights are determined by initial conditions and linear recursions.

8. The method as recited in claim 7, wherein the j-weights and k-weights are selected to have limited spans $S^{(j)}$ and $S^{(k)}$, respectively.

9. The method as recited in claim 1, wherein the (G, I, M)-constrained 2N-bit output sequences limit the lengths of all periodic input sequences of period 1, 2 and 4.

10. The method as recited in claim 1, further comprising adjusting the modulation constraints to weaken or tighten the code at designated locations.

11. A decoding method, comprising:
receiving a bit sequence of length 2N;
splitting a bit sequence into even and odd interleaves;
decoding each of the interleaves by employing a respective enumerative maximum transition run (eMTR) decoder using j-weights and offset demapping; and
transforming the eMTR-decoded even and odd interleaves into a binary decoder output sequence.

12. The method as recited in claim 11, wherein transforming the eMTR-decoded even and odd interleaves includes multiplexing the even and odd bit streams into a single even/odd interleaved bit stream.

13. The method as recited in claim 11, wherein transforming the eMTR-decoded even and odd interleaves includes applying a demapper and a prefix encoder inverse to map the even and odd bit sequences into a single bit sequence.

14. An encoder system for encoding a stream of K-bit input sequences into a stream of (G, I, M)-constrained 2N-bit output sequences, comprising:
an input splitter configured to transform each K-bit input bit sequence into two separate data paths including even and odd bits;
a first enumerative maximum-transition-run (eMTR) encoder configured to encode the even bits to generate constrained even bits;
a second enumerative maximum-transition-run (eMTR) encoder configured to encode the odd bits to generate constrained odd bits;
a multiplexer coupled to the first and second encoders to interleave the constrained even and constrained odd bits to form a stream of (G, I, M)-constrained 2N-bit output sequences where G is a global constraint, I is an interleave constraint, and M is a variable frequency oscillator constraint of a partial-response maximum-likelihood (PRML) code.

15. The system as recited in claim 14, wherein the input splitter includes one of a demultiplexer and a prefix encoder to split the input bits into an even bit sequence and an odd bit sequence.

16. The system as recited in claim 14, wherein each eMTR encoder includes an offset mapper configured to offset bits by a lower bound of an input space.

17. The system as recited in claim 14, wherein the eMTR code includes two sets of weights including j-weights $\{w_n\}$ and combined weights of k-weights and j-weights $\{v_n + w_n\}$, each set of weights including N elements.

18. The system as recited in claim 14, wherein the PRML codes includes a PRML(G, I, M)-constrained code which limits a length of all periodic input sequences of period 1, 2 and 4.

19. The system as recited in claim 14, further comprising a bit inverter applied to invert encoded bits.

20. The system as recited in claim 14, further comprising adjusting the modulation constraints to weaken or tighten the constraints at designated locations.

21. A decoder system, comprising:
a bit inverter configured to bit invert a length-2N decoder input sequence into a bit-inverted input sequences;
a demultiplexer configured to separate the bit-inverted input sequence of length 2N into an even bit path and an odd bit path;
two enumerative maximum transition run (eMTR) decoders coupled to each path and configured to decode the length-N bit sequences into an even interleave and an odd interleave; and
an input splitter inverse configured to transform the eMTR-decoded even and odd interleaves into a binary decoder output sequence.

22. The system as recited in claim 21, wherein the input splitter inverse includes one of a multiplexer and a prefix decoder to transform the even and odd interleaves into a binary decoder output sequence.

23. The system as recited in claim 21, wherein the eMTR decoders each include an offset demapper configured to offset bits input to the demapper by a lower bound of an input space in accordance with the j-weights and the k-weights.

* * * * *